(12) United States Patent
Katoh et al.

(10) Patent No.: US 8,347,469 B2
(45) Date of Patent: Jan. 8, 2013

(54) CRYSTAL OSCILLATOR PIECE AND METHOD FOR MANUFACTURING THE SAME

(75) Inventors: Akiko Katoh, Tokorozawa (JP); Takashi Moriya, Higashimurayama (JP)

(73) Assignee: Citizen Holdings Co., Ltd., Tokyo (JP)

( * ) Notice: Subject to any disclaimer, the term of this patent is extended or adjusted under 35 U.S.C. 154(b) by 538 days.

(21) Appl. No.: 12/532,979

(22) PCT Filed: Mar. 26, 2008

(86) PCT No.: PCT/JP2008/056537
§ 371 (c)(1),
(2), (4) Date: Sep. 24, 2009

(87) PCT Pub. No.: WO2008/117891
PCT Pub. Date: Oct. 2, 2008

(65) Prior Publication Data
US 2010/0084948 A1 Apr. 8, 2010

(30) Foreign Application Priority Data
Mar. 26, 2007 (JP) ................. 2007-079283

(51) Int. Cl.
*H01L 41/22* (2006.01)
*H04R 17/00* (2006.01)
(52) U.S. Cl. .............. 29/25.35; 216/2; 216/41
(58) Field of Classification Search .......... None
See application file for complete search history.

(56) References Cited

U.S. PATENT DOCUMENTS
2006/0175288 A1* 8/2006 Aratake .......... 216/41

FOREIGN PATENT DOCUMENTS
| JP | 2005-277482 | 10/2005 |
| JP | 2006-214779 | 8/2006 |
| JP | 2006-217497 | 8/2006 |
| JP | 2006-269738 | 10/2006 |

* cited by examiner

OTHER PUBLICATIONS

International Search Report from the Japanese Patent Office, mailed May 13, 2008, for International Application No. PCT/JP2008/056537, filed Mar. 26, 2008.

*Primary Examiner* — Duy Deo
(74) *Attorney, Agent, or Firm* — Finnegan, Henderson, Farabow, Garrett & Dunner, L.L.P.

(57) ABSTRACT

An object of the present invention is to provide a crystal oscillator piece in which the generation of leakage vibration is suppressed, and a method for manufacturing such a crystal oscillator piece. More specifically, a method for manufacturing a crystal oscillator piece according to the present invention includes the steps of forming a first etching mask on an upper surface of a crystal wafer and a second etching mask on a lower surface of the crystal wafer, and forming a vibrating tine by immersing the crystal wafer in an etching solution thereby dissolving crystal portions not covered with the first and second etching masks, wherein the second etching mask is designed to have a first protruding portion protruding from a position corresponding to a first edge of the first etching mask, the first protruding portion being chosen to have such a length that a first residue is formed in a predetermined shape on a first side face, irrespective of a positional displacement between the first and second etching masks, and wherein the first and second etching masks are designed so that a second residue formed on a second side face is adjusted so as to ensure that one of two principal axes passing through a centroid and dynamically perpendicular to each other in a cross section taken perpendicularly to a longitudinal direction of the vibrating tine is oriented substantially parallel to the upper or lower surface of the crystal wafer.

5 Claims, 14 Drawing Sheets

CRYSTAL OSCILLATOR PIECE AND METHOD FOR MANUFACTURING THE SAME

FIELD OF THE INVENTION

The present invention relates to a crystal oscillator piece and a method for manufacturing the same, and more particularly to a crystal oscillator piece that has a structure for suppressing the occurrence of leakage vibration correspond to out-of-plane vibration, and a method for manufacturing such a crystal oscillator piece.

BACKGROUND OF THE INVENTION

A tuning fork crystal oscillator used for a vibratory gyro is manufactured by the steps of cutting a crystal oscillator piece to a desired shape from a crystal wafer, forming electrodes for causing the crystal oscillator piece to oscillate, and packaging the crystal oscillator piece with the electrodes formed thereon into a container. Of these steps, the step of cutting the crystal oscillator piece from a crystal wafer is particularly important because the shape of the crystal oscillator piece determines the motion of vibration and greatly affects the device performance.

FIG. 8 is a diagram showing crystal axes of a crystal oscillator piece.

As shown in FIG. 8, the crystal oscillator piece is formed from a Z-cut crystal wafer cut along a plane perpendicular to the Z axis of the crystal or from a crystal wafer 100 obtained by rotating through 0° to 10° about the X axis with respect to the Z-cut crystal wafer. The crystal axes of the crystal wafer, after rotation about the X axis, are X, Y', and Z'. This means that the principal plane of the crystal wafer 100 is the X-Y' plane.

FIG. 9 is a diagram schematically showing the crystal oscillator piece 110 cut from the crystal wafer 100.

FIG. 9(a) is a schematic plan view of the crystal oscillator piece 110, FIG. 9(b) is a diagram showing one example of a cross-sectional view taken along A-A' in FIG. 9(a), and FIG. 9(c) is a diagram showing another example of a cross-sectional view taken along A-A' in FIG. 9(a).

The crystal oscillator piece 110 comprises a support portion 111, a base portion 112, and vibrating tines 113. The vibrating tines 113 are the portions that vibrate. The vibrating tines 113 each have a width extending in the X axis direction, a length in the Y' axis direction, and a thickness in the Z' axis direction.

In the step of cutting the crystal oscillator piece 110 from the crystal wafer 100, a method utilizing photolithography and wet etching is employed because small-sized crystal oscillator pieces with good accuracy and at low cost can be mass-produced.

FIG. 10 is a diagram showing a method for manufacturing the crystal oscillator piece. FIG. 10 shows cross sections of the vibrating tines of the crystal oscillator piece.

First, as shown in FIG. 10(b), corrosion resistant metal films 200a and 200b having resistance to crystal etchants and photoresist films 201a and 201b overlying the corrosion resistant metal films 200a and 200b are formed on the upper and lower surfaces of the crystal wafer 100 prepared to a desired thickness as shown in FIG. 10(a).

Next, as shown in FIG. 10(c), the photoresist films 201a and 201b are exposed to radiation through two photomasks 205 and 206 with oscillator patterns written thereon that perfectly overlay each other when they are placed facing each other.

Next, the photoresist films 201a and 201b are developed. Then, using the thus developed photoresist patterns as masks, the corrosion resistant metal films 200a and 200b are patterned, as shown in FIG. 10(d), to form etching masks 207a and 207b for crystal etching.

Next, the remaining photoresist films 201a and 201b are removed. Thereafter, the crystal wafer 101 with the etching masks 207a and 207b formed on both surfaces thereof is immersed in an etching solution of hydrofluoric acid, and the portions of the crystal that are not covered with the etching masks 207a and 207b are dissolved from both surfaces, as shown in FIG. 10(e). After that, the etching masks 207a and 207b are removed, completing the fabrication of the crystal oscillator piece 110 such as shown in FIG. 9(a).

In another method for manufacturing of a crystal oscillator piece, an etching mask is patterned only on one surface, with the other surface completely covered with a corrosion resistant metal film, and etching is performed from the one surface (for example, refer to patent document 1).

In still another method for manufacturing of a crystal oscillator piece, as shown in FIG. 11, the etching mask pattern 207d on the lower surface is formed wider than the pattern 207c on the upper surface, and etching is performed using the pattern 207c on the upper surface as the reference pattern (for example, refer to patent document 2).

FIG. 12 is a diagram explaining the direction of vibration of the crystal oscillator piece.

FIG. 12(a) is a perspective view of the crystal oscillator piece, FIG. 12(b) is a diagram showing one example of the direction of vibration in an A-A' cross section of FIG. 12(a), and FIG. 12(c) is a diagram showing another example of the direction of vibration in the A-A' cross section of FIG. 12(a).

As shown in FIG. 12(a), when using the tuning fork crystal oscillator for a vibratory gyro, flexural vibration in the X axis direction is used as driving vibration, and flexural vibration in the Z' axis direction is used as detection vibration which occurs when an angular velocity is applied. In this arrangement, in the absence of an applied angular velocity, the vibration in the Z' axis direction should not normally occur, as shown in FIG. 12(b). However, in the tuning fork crystal oscillator manufactured by the prior art manufacturing method, there have been cases where a vibration component in the Z' axis direction is observed, as shown in FIG. 12(c), when no angular velocity is actually applied. The vibration component in the Z' axis direction arising from this oblique vibration is called the leakage vibration; since this vibration is indistinguishable from the detection vibration, there has been the problem that the S/N and temperature characteristics of the gyro degrade due to the leakage vibration.

In the case of tuning fork crystal oscillators for ordinary applications, the tuning fork vibration is likewise produced by using the flexural vibration in the X axis direction, and in this case also, there has been the problem that the oblique vibration containing the Z' direction component causes the crystal impedance to rise, leading to degradation of the characteristics.

It is believed that crystal residues generated when fabricating the crystal oscillator piece by etching have some bearing on the oblique vibration. The crystal has etching anisotropy, which means that the etch rate is different in different directions of the crystal. As a result, the crystal is not uniformly etched, leaving residues on the side faces of the vibrating tines 113 of the crystal oscillator piece after etching. For example, as shown in FIGS. 9(b) and 9(b), the cross-sectional shapes of the vibrating tines of the crystal oscillator piece 110 are not precisely rectangular, but residues of triangular or other shapes are formed on the +X and −X side faces in the Y'-Z' plane. FIG. 9(b) shows the cross-sectional shapes after etching for a short time, and FIG. 9(c) shows the cross-sectional shapes after etching for a long time.

If such residues are present, the driving vibration which should normally occur only in the X axis direction, as shown in FIG. 12(b), may be disrupted, depending on how the residues are formed, and the vibration occurs in the oblique direction by being accompanied by a component vibrating in the Z' axis direction. This results in the generation of leakage vibration.

The leakage vibration arising from such oblique vibration tends to occur rather often when the crystal oscillator piece is manufactured by the prior art method. There has therefore developed a need to suppress the oblique vibration and reduce the leakage vibration.

Further, the relationship between the oblique vibration and the directions of the principal axes of cross section of the crystal oscillator piece is analyzed in non-patent document 1. The term "principal axes of cross section" or "principal axes" will also be used in the description given hereinafter, and it is to be understood that this terms refers to the principal axes that pass through the centroid of the vibrating tine cross section.

Patent document 1: Japanese Unexamined Patent Publication No. S52-035592 (Page 3, FIG. 4)

Patent document 2: Japanese Unexamined Patent Publication No. 2006-217497 (Page 5, FIG. 1)

Non-patent document 1: Motohiro FUJIYOSHI et al., IEICE Transactions, C Vol. J87-C, No. 9, pp. 712-719

SUMMARY OF THE INVENTION

The relationship between the oblique vibration and the residues in the vibrating tine cross section will be further investigated below. The vibrating tine cross section refers to the cross section (cross section A-A' in FIG. 9(a)) taken perpendicularly to the longitudinal direction of the vibrating tine, and corresponds to the X-Z' plane of the crystal.

Generally, when investigating the flexure of a beam or the like, the principal axes of cross section are often considered. The principal axes of cross section consist of two mutually perpendicular axes, and when a bending force is applied to the beam in the same direction as one of the principal axes, the beam bends in the same direction as the direction of the bending force. On the other hand, when a bending force is applied in a direction different than the directions of the principal axes, the beam bends in a direction different than the direction in which the bending force is applied.

In the case of a crystal oscillator, the bending force due to the piezoelectric effect is applied along the X axis. Therefore, if one of the principal axes is parallel to the X axis, the vibration occurs in the X axis direction, and no leakage vibration results. On the other hand, if the principal axis is tilted away from the X axis toward the Z' axis, since the direction of the bending force does not coincide with the direction of the principal axis, oblique vibration containing a Z' axis component occurs, resulting in the generation of leakage vibration.

The directions of the principal axes are determined by the cross-sectional shape of the beam (vibrating tine). As a simple example, in the case of a cross section having an axis of symmetry, the axis of symmetry and an axis perpendicular to it are the principal axes of the cross section. For example, in the case of a rectangular cross section, the lines that bisect the respective pairs of opposite sides are the principal axes.

If a crystal oscillator free from leakage vibration is to be obtained, it is required that one of its principal axes be parallel to the X axis.

An investigation is made to see whether a crystal oscillator piece one of whose principal axes is parallel to the X axis can be obtained when the oscillator piece is manufactured by the prior art method. As earlier described, when a crystal oscillator piece is manufactured by wet etching, residues invariably remain on the side faces of the vibrating tines. The directions of the principal axes of cross section are therefore determined depending on how the residues are formed. When considering the principal axes of cross section of the crystal oscillator piece, first it is necessary to consider how the residues are formed.

Since the residue shape varies depending on the etching time and etching conditions, it is not possible to generalize, but the process of formation is roughly the same; therefore, the process of residue formation will be described below based on the results observed from the experiment conducted by the present inventor.

FIG. 13 is an enlarged cross-sectional view of FIG. 10(e), showing the formation of residues on the vibrating tine of the crystal oscillator piece. For simplicity, only one tine is shown here, and the side face on the −X side of the crystal axis is denoted as the first side face, while the side face on the +X side is denoted as the second side face.

As shown in FIG. 13(a), when the etching time is relatively short, the residue is formed on the second side face, at an angle of about 2° with respect to the Z' axis in regions near the principal faces of the oscillator, that is, the upper surface 113a and the lower surface 113b, and at an angle of about 22° in regions farther away from them. Though the depth varies depending on the etching time, the process is essentially the same for both the upper surface 113a and the lower surface 113b. As shown in FIG. 13(b), when the etching is continued for a relatively long time, the portion forming the angle of 22° is etched away, and only the portion forming the angle of 2° is left unetched. The residue formed on the first side face is very small as shown in the illustrated example, but when closely observed, the residue is surely formed at an angle of about 1° with respect to the Z' axis, as shown in FIGS. 13(a) and 13(b). The residue shape on the first side face is relatively unaffected by the etching time. The etching starts from the edges of the respective etching masks 207a and 207b, and proceeds on both sides independently of each other until the wafer is etched through.

The following defects can be caused when the crystal oscillator piece is manufactured by the prior art method that performs etching from both the upper and lower surfaces as previously shown in FIG. 10.

As shown in FIG. 14(a), if the etching mask 207a formed on the upper surface of the crystal wafer and the etching mask 207b on the lower surface are in perfect alignment, the cross section of the vibrating tine 113 of the crystal oscillator piece, after etching, is vertically symmetrical about an axis of symmetry that is parallel to the X axis. That is, the cross section of the vibrating tine 113 of the crystal oscillator piece has a principal axis 300 parallel to the X axis. In this case, leakage vibration does not occur since the direction of the bending force and the direction of the principal axis both coincide with the X axis direction.

On the other hand, if the etching mask 207a formed on the upper surface of the crystal wafer and the etching mask 207b on the lower surface are displaced relative to each other in the X axis direction, then the cross-sectional shape of the vibrating tine 113 of the crystal oscillator piece becomes asymmetrical, as shown in FIG. 14(b), and when the direction of the principal axis is calculated, the principal axis 300a is not parallel to the X axis. In this case, since the direction of the bending force and the direction of the principal axis are different, oblique vibration occurs, resulting in the generation of leakage vibration.

If a positional displacement, a, occurs between the etching masks 207a and 207b, as shown in FIG. 14(b), the corresponding positional displacement, a, occurs between the upper surface 113a and the lower surface 113b in the cross section of the vibrating tine 113, as shown in FIG. 15(a). The angle of displacement of the principal axis at this time is shown in FIG. 15(b). In FIG. 15(b), Xa indicates, of the two principal axes, the principal axis that is closer to the X axis, and the angle of displacement of the principal axis Xa relative to the X axis is denoted by γ (°) (γ<90); FIG. 16 shows the relationship between the angle of displacement, γ (°), of the principal axis Xa relative to the X axis and the positional displacement, a, occurring between the etching masks 207a and 207b in the prior art manufacturing method.

In FIG. 16, the abscissa represents the positional displacement, a, between the upper etching mask 207a and the lower etching mask 207b, and the ordinate represents the angle of displacement, γ (°), of the principal axis Xa relative to the X axis. The positional displacement, a, between the etching masks 207a and 207b is taken to be positive when the upper etching mask is displaced in the −X direction from the lower etching mask, and γ is taken to be positive when the displacement is in the counterclockwise direction. As can be seen from the graph of FIG. 16, there is correlation, in both magnitude and direction, between the positional displacement, a, and the angle of displacement, γ.

Furthermore, if the positional displacement, a, occurs between the upper etching mask 207a and the lower etching mask 207b, both edges of the upper surface 113a in the cross section of the vibrating tine 113 become displaced relative to the corresponding edges of the lower surface 113b by the same amount, a, in the same direction at the same time; since they are added together, the directional displacement of the principal axis is magnified, resulting in the reinforcement of the leakage vibration.

To address this, if the leakage vibration is to be reduced sufficiently so that satisfactory characteristics can be obtained, the upper etching mask and the lower etching mask must be registered with each other with submicron-order accuracy in the etching step, to produce the crystal oscillator piece having a vertically symmetrical shape such as shown in FIG. 14(a). However, even if a high-accuracy double-side alignment exposure apparatus is used, there is a limit to the upper/lower mask alignment accuracy that can be achieved, and this has led to the problem that the production yield is low.

On the other hand, when etching is performed only from one side or, as shown in FIG. 11, using the upper surface pattern as the reference, the problem of the positional displacement between the upper etching mask and the lower etching mask does not arise, but since the angle at which the residue is formed on one side face is different from the angle at which the residue is formed on the other side face, the cross-sectional shape is not symmetrical, and when the direction of the principal axis is calculated, the cross section does not have a principal axis parallel to the X axis. This method can constantly produce oscillator pieces of uniform quality and is therefore effective in achieving resonant frequency stability, but it is not suited for the purpose of achieving an oscillator piece substantially free from leakage vibration.

In this way, the prior art method has had the problem that, as described above, it is difficult to stably produce a crystal oscillator piece whose principal axis in the vibrating tine cross section is oriented substantially parallel to the X axis to suppress the generation of leakage vibration.

It is an object of the present invention to provide a crystal oscillator piece that can solve the above-described problem of the prior art, and a method for manufacturing such a crystal oscillator piece.

It is another object of the present invention to provide a crystal oscillator piece in which the generation of leakage vibration is suppressed (the relative value of the leakage output is reduced), and a method for manufacturing such a crystal oscillator piece.

It is still another object of the present invention to provide a crystal oscillator piece that has a principal axis parallel to the X axis though the cross-sectional shape of the vibrating tine is not symmetrical, and a method for manufacturing such a crystal oscillator piece.

It is a further object of the present invention to provide a crystal oscillator piece that has a principal axis parallel to the X axis though the cross-sectional shape of the vibrating tine is not symmetrical, that can be produced stably compared with the prior art, and that can suppress the generation of leakage vibration, and a method for manufacturing such a crystal oscillator piece, by ingeniously designing the geometries of the upper etching mask and lower etching mask used in the step of etching the crystal wafer from both the upper and lower surfaces thereof.

A method for manufacturing a crystal oscillator piece according to the present invention includes the steps of forming a first etching mask on an upper surface of a crystal wafer and a second etching mask on a lower surface of the crystal wafer, and forming a vibrating tine by immersing the crystal wafer in an etching solution thereby dissolving crystal portions not covered with the first and second etching masks, wherein the second etching mask is designed to have a first protruding portion protruding from a position corresponding to a first edge of the first etching mask, the first protruding portion being chosen to have such a length that a first residue is formed in a predetermined shape on a first side face, irrespective of a positional displacement between the first and second etching masks, and wherein the first and second etching masks are designed so that a second residue formed on a second side face is adjusted so as to ensure that one of two principal axes passing through a centroid and dynamically perpendicular to each other in a cross section taken perpendicularly to a longitudinal direction of the vibrating tine is oriented substantially parallel to the upper or lower surface of the crystal wafer.

Preferably, in the method for manufacturing the crystal oscillator piece according to the present invention, the second etching mask is designed to have a second protruding portion protruding from a position corresponding to a second edge of the first etching mask, the second protruding portion being chosen to have such a length that the second residue is formed on the second side face when there is no positional displacement between the first and second etching masks.

Preferably, in the method for manufacturing the crystal oscillator piece according to the present invention, the first etching mask is formed with a width smaller than the width of the second etching mask, and the first etching mask and the second etching mask are formed on the respective surfaces of the wafer in such a manner that a difference, b, between the first edge of the first etching mask and the corresponding first edge of the second etching mask, as measured at the first side face, satisfies the relation b>t×tan α, where t represents the thickness of the crystal wafer and α an etching angle at the first side face.

Preferably, in the method for manufacturing the crystal oscillator piece according to the present invention, the first etching mask and the second etching mask are formed on the respective surfaces of the crystal wafer in such a manner that the difference, b, between the first edge of the first etching mask and the corresponding first edge of the second etching mask satisfies the relations b=t×tan α+k and k>p, where p represents the accuracy of alignment between the first etching mask and the second etching mask.

Preferably, in the method for manufacturing the crystal oscillator piece according to the present invention, the first etching mask is formed with a width smaller than the width of the second etching mask, and the first etching mask and the second etching mask are formed on the respective surfaces of the crystal wafer in such a manner that a difference, c, between the second edge of the first etching mask and the corresponding second edge of the second etching mask, as measured at the second side face, satisfies the relation c<t×tan α, where t represents the thickness of the crystal wafer and α the etching angle at the first side face.

Preferably, in the method for manufacturing the crystal oscillator piece according to the present invention, the first etching mask is formed with a width smaller than the width of the second etching mask, and the first etching mask and the second etching mask are formed on the respective surfaces of the crystal wafer in such a manner that the difference, c, between the second edge of the first etching mask and the corresponding second edge of the second etching mask, as measured at the second side face, satisfies the relation c=0.7× t×tan α, where t represents the thickness of the crystal wafer and α the etching angle at the second side face.

A crystal oscillator piece according to the present invention includes an upper surface and a lower surface having different widths and formed substantially parallel to each other; a vibrating tine having a first side face and a second side face formed between the upper surface and the lower surface, a first residue formed in a predetermined shape on the first side face so as to provide a single sloping face, and a second residue formed on the second side face, wherein the second residue is adjusted so as to ensure that one of two principal axes passing through a centroid and dynamically perpendicular to each other in a cross section taken perpendicularly to a longitudinal direction of the vibrating tine is oriented substantially parallel to the upper surface or the lower surface.

A crystal oscillator piece according to the present invention is manufactured by etching a crystal wafer from both the upper and lower surfaces thereof, and includes a vibrating tine that includes an upper surface and a lower surface having different widths, a first side face formed from a single sloping face, and a second side face formed from a plurality of sloping faces, wherein the upper surface is chosen to have a width smaller than the width of the lower surface, satisfying the relations A=t×tan α and B<A, where A represents the difference between an edge of the upper surface at the first side face and an edge of the lower surface at the first side face as measured in the width direction, B the difference between an edge of the upper surface at the second side face and an edge of the lower surface at the second side face as measured in the width direction, α the etching angle at the first side face, and t the thickness of the crystal wafer, and wherein one of two principal axes passing through a centroid and dynamically perpendicular to each other in a cross section taken perpendicularly to a longitudinal direction of the vibrating tine is oriented substantially parallel to the upper surface.

Preferably, in the crystal oscillator piece according to the present invention, the second side face has two or more sloping faces and a ridge formed by the two or more sloping faces, and is formed in a convex shape.

According to the above structure, since the first side face is formed from a single sloping face, the difference A between the upper and lower surfaces at the first side face, as measured in the width direction, is always the same provided that the wafer thickness t is held constant, while on the other hand, the difference B between the upper and lower surfaces at the second side face, as measured in the width direction, is adjusted so that one of the principal axes of the vibrating tine cross section is oriented substantially parallel to the X axis; as a result, the direction in which the bending force is applied due to the piezoelectric effect coincides with the direction of one of the principal axes of the cross section, so that the driving vibration does not occur obliquely to the principal plane of the oscillator but occurs in parallel to it, and hence no leakage vibration in the Z' axis direction. In the prior art method, both A and B are affected by manufacturing variations, but in the present invention, only B is affected by manufacturing variations, and thus the leakage vibration associated with the positional displacement between the upper and lower etching masks can be reduced to about one half.

The crystal oscillator piece according to the present invention is preferably used for a vibratory gyro.

When the crystal oscillator piece of the present invention is used for a vibratory gyro, the S/N ratio of the vibratory gyro can be improved, and stable temperature characteristics can be achieved.

A method for manufacturing a crystal oscillator piece by etching a crystal wafer from both upper and lower surfaces thereof using etching masks according to the present invention is characterized in that the second etching mask is formed larger than the first etching mask, the second etching mask having a first protruding portion protruding from a position corresponding to one edge of the first etching mask and a second protruding portion protruding from a position corresponding to the other edge, satisfying the relations b>t×tan α and c<t×tan α, where b represents a first amount of protrusion defining the first protruding portion, t the thickness of the crystal wafer, a the etching angle at the first side face, and c a second amount of protrusion defining the second protruding portion.

According to the above structure, when the residue on the first side face is formed at angle α relative to the Z' axis, only one sloping face is formed by etching the crystal wafer from the upper surface, since the lower etching mask is formed longer than the upper etching mask by an amount greater than t×tan α. As a result, the residue on the first side face is always formed in a predetermined shape in a stable manner. Further, since the residue on the second side face is formed at an angle greater than a relative to the Z' axis, if the second amount of protrusion, c, is set smaller than t×tan α the residue on the second side face balances with the residue on the first side face, and one of the principal axes becomes parallel to the X axis, eliminating the possibility of the leakage vibration. In the presence of a positional displacement between the upper and lower etching masks, if identical pattern masks are used for the upper and lower surfaces, as in the prior art method, the first and second side faces are both displaced, and the displacements are added together, thus magnifying the leakage vibration, but in the present invention, since only the second side face is affected by the positional displacement, the leakage vibration can be reduced to about one half.

Preferably, in the method for manufacturing the crystal oscillator piece, the first amount of protrusion, b, satisfies the relationship b=t×tan α+k and k>p, where k represents the amount of mask offset and ±p the accuracy of mask alignment.

According to the above structure, when the residue on the first side face is formed at angle α relative to the Z' axis, and when the accuracy of etching mask alignment between the upper and lower surfaces is ±p, then even if a positional displacement of p occurs, only one sloping face is formed on the first side face by etching from the upper surface, and the residue on the first side face is always formed in a predetermined shape, because the amount of mask offset, k, of the lower etching mask is set larger than the value of the alignment accuracy.

The crystal oscillator piece manufactured by the manufacturing method according to the present invention is preferably used for a vibratory gyro.

According to the above structure, the S/N ratio of the vibratory gyro can be improved, and stable temperature characteristics can be achieved.

In the prior art, both side faces of the vibrating tine have been affected by the positional displacement between the upper and lower etching masks, but in the present invention, since only one side face is affected, the leakage vibration can be reduced to about one half compared with the prior art.

DETAILED DESCRIPTION OF THE PREFERRED EMBODIMENT

A crystal oscillator piece according to the present invention and a method for manufacturing the same will be described below with reference to the drawings. It should, however, be noted that the technical scope of the present invention is not limited to the specific embodiments described herein, but extends to the inventions described in the appended claims and their equivalents.

First, the method for manufacturing the crystal oscillator piece according to the present invention will be described with reference to FIG. 1.

Figure 1A:
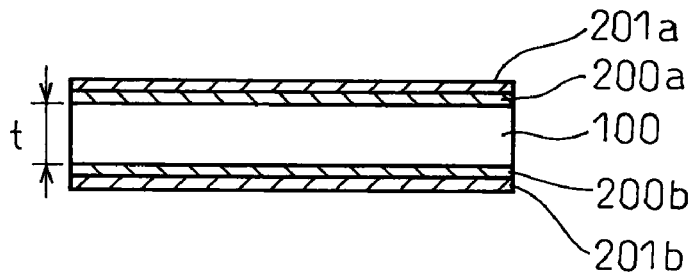
FIGS. 1(a) to 1(e) are diagrams showing the manufacturing steps of a crystal oscillator piece according to an embodiment of the present invention.

FIG. 1(a) shows the condition in which corrosion resistant metal films 200a and 200b are formed by such means as sputtering, evaporation, or plating on the upper and lower surfaces of a crystal wafer 100 prepared to a thickness t. The corrosion resistant metal films 200a and 200b can each be formed using Cr for the base layer and Au or the like for the top layer. Photoresist films 201a and 201b are applied over the surfaces of the respective corrosion resistant metal films 200a and 200b.

Figure 1B:
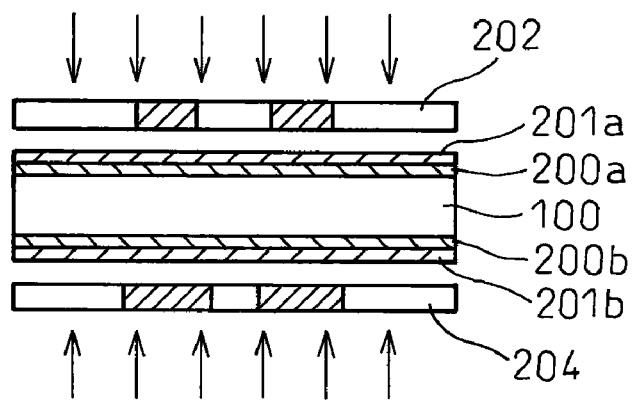
Figure 1C:
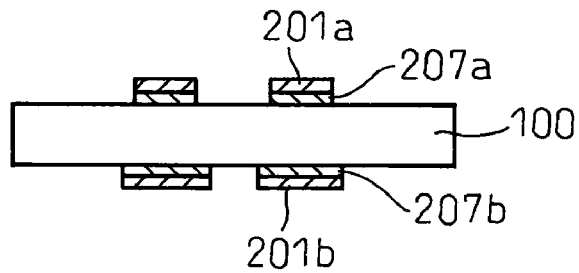

Next, as shown in FIG. 1(b), upper and lower photomasks 202 and 204 are aligned with respect to each other using a double-side alignment apparatus (not shown), and the photoresist films 201a and 201b are exposed to radiation through the two photomasks 202 and 204. Next, the photoresist films 201a and 201b are developed, and using the thus developed photoresist patterns as masks, the corrosion resistant metal films 200a and 200b are patterned in the shape of the oscillator, to form etching masks 207a and 207b of corrosion resistant metal films, as shown in FIG. 1(c). The photoresist films 201a and 201b may be removed immediately after forming the etching masks 207a and 207b of corrosion resistant metal films, or may be left thereon and removed in a subsequent process step.

Figure 1D:
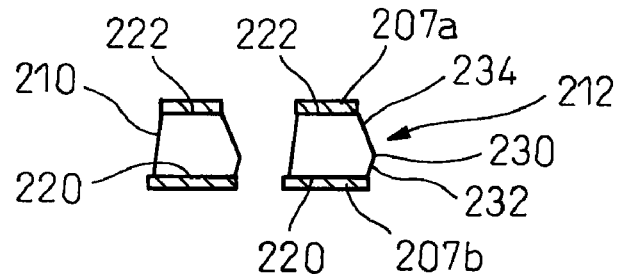

Next, the crystal wafer 100 with the etching masks 207a and 207b of corrosion resistant metal films formed on both surfaces thereof (see FIG. 1(c)) is immersed in a hydrofluoric-acid-containing etching solution, and the portions of the crystal that are not covered with the corrosion resistant metal films 207a and 207b are dissolved away. In FIG. 1(d), only the cross-sectional shapes of the vibrating tines 313 of the crystal oscillator piece are shown.

Figure 1E:
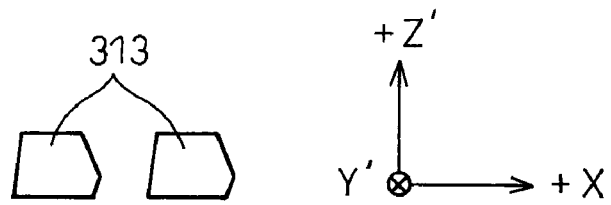
Figure 9A:
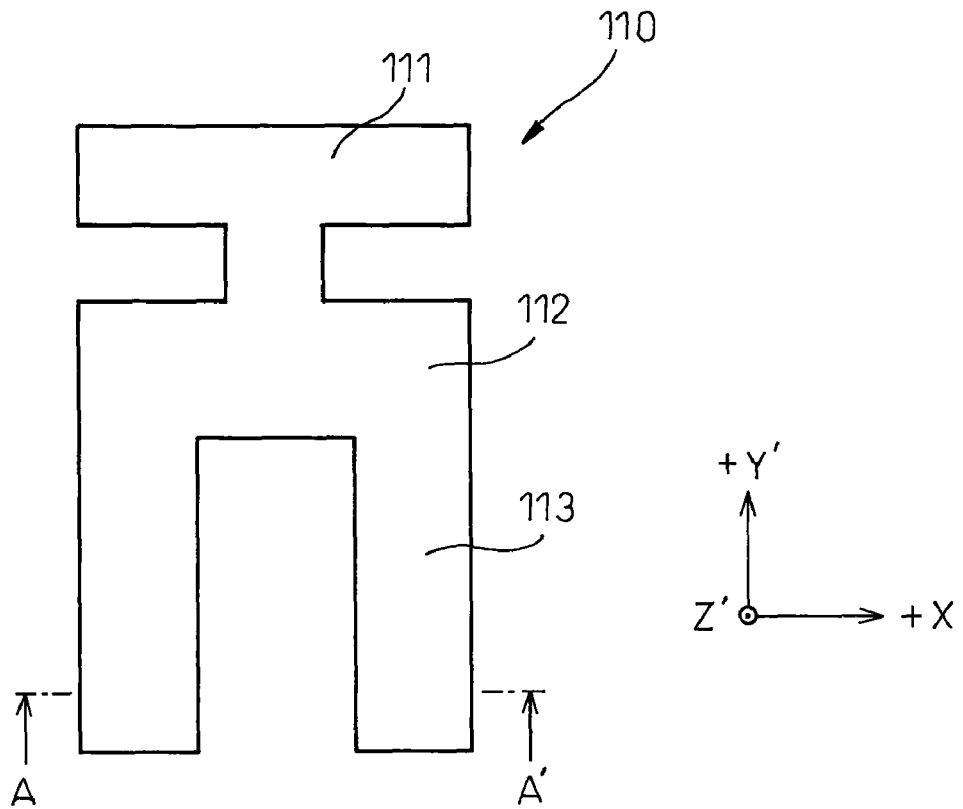
FIG. 9(a) is a plan view of a crystal oscillator piece.
Figure 9B:
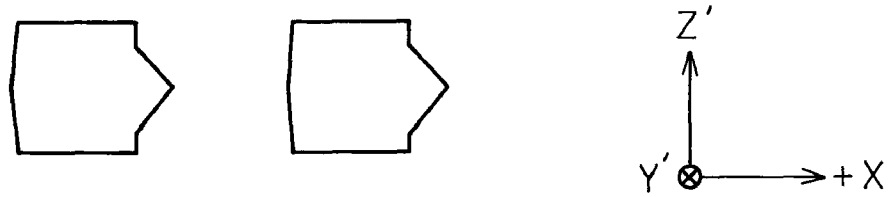
FIG. 9(b) is a diagram showing one example of a cross-sectional view taken along A-A' in FIG. 9(a)
Figure 9C:
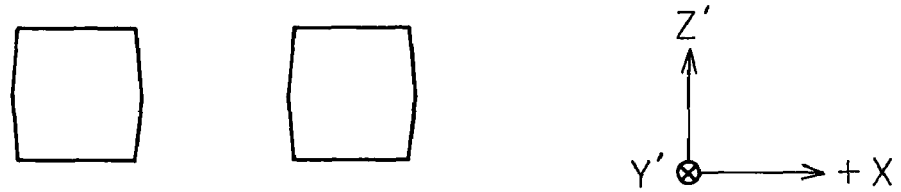
FIG. 9(c) is a diagram showing another example of a cross-sectional view taken along A-A' in FIG. 9(a).
Figure 10A:
FIGS. 10(a) to 10(e) are diagrams showing the cross section of the manufacturing steps of a crystal oscillator piece according to the prior art.
Figure 10B:
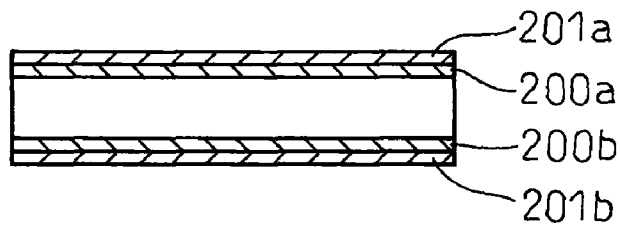
Figure 10C:
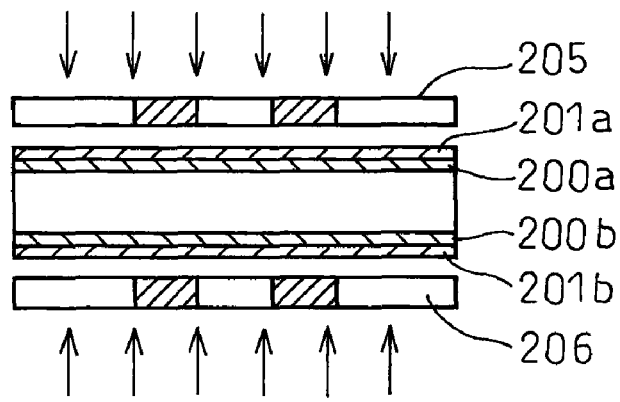
Figure 10D:
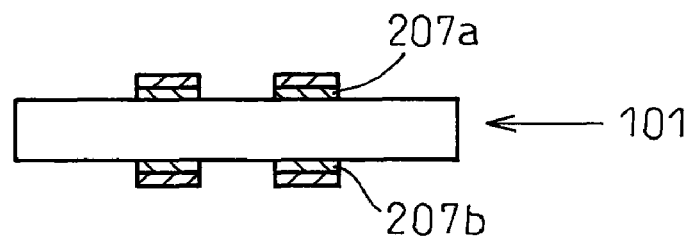
Figure 10E:
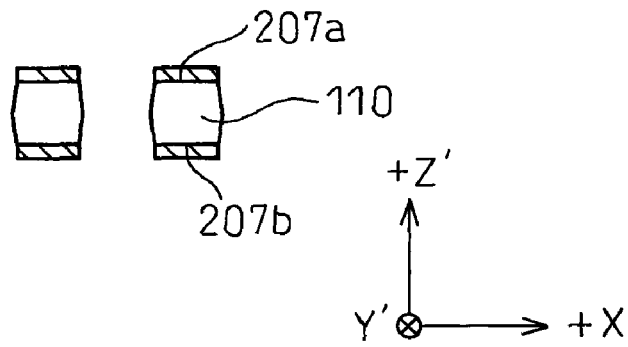
Figure 11:
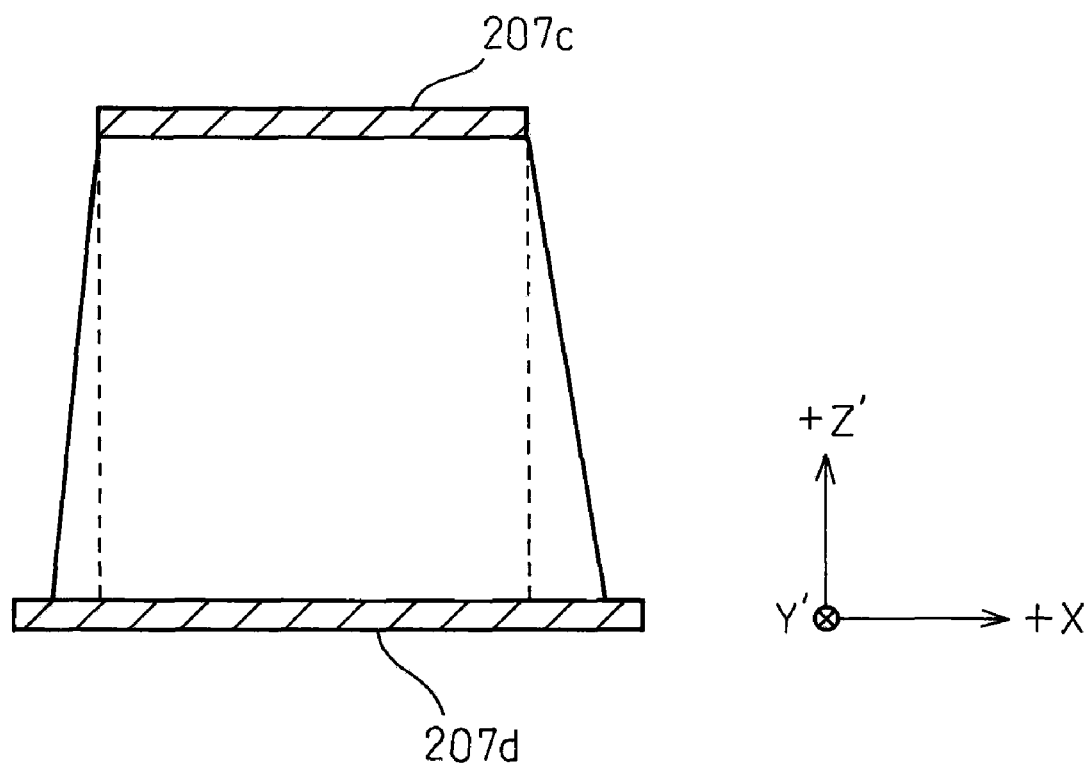
FIG. 11 is a cross-sectional view of a vibrating tine of the crystal oscillator piece according to the prior art.
Figure 12A:
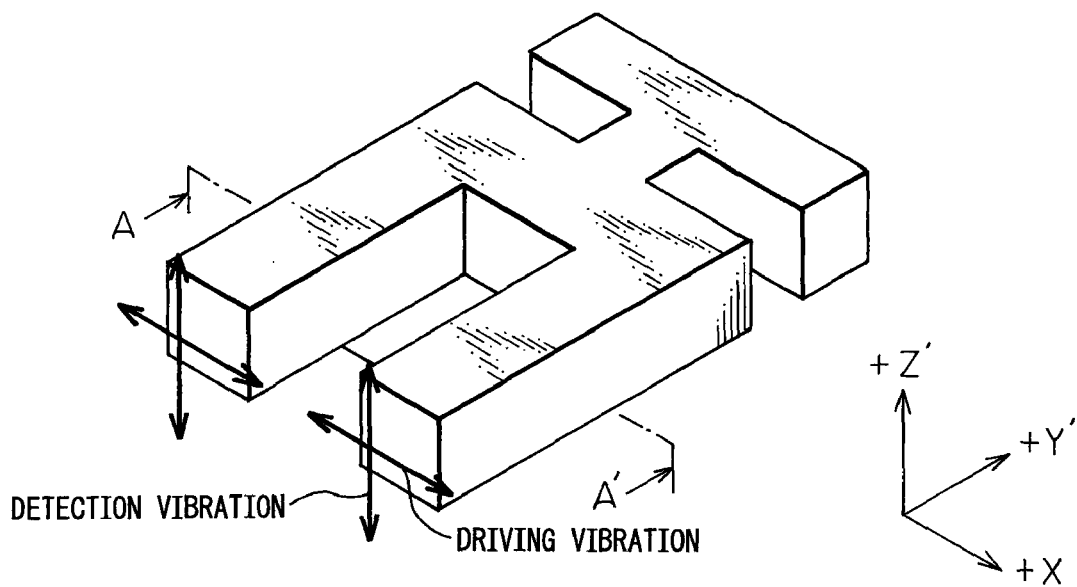
FIG. 12(a) is a perspective view of the crystal oscillator piece.
Figure 12B:
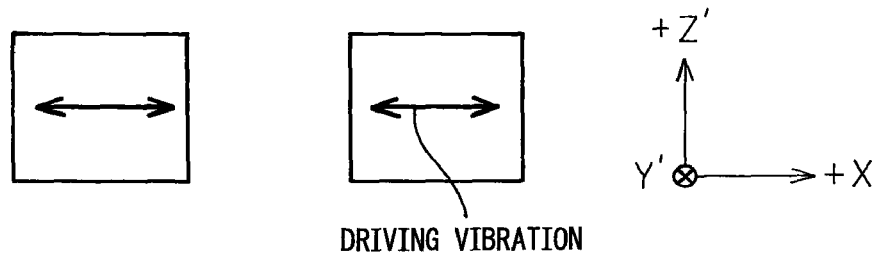
FIG. 12(b) is a diagram showing one example of the direction of vibration in an A-A' cross section of FIG. 12(a)
Figure 12C:
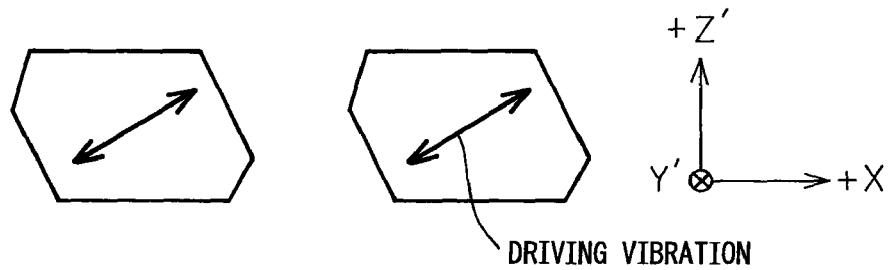
FIG. 12(c) is a diagram showing another example of the direction of vibration in the A-A' cross section of FIG. 12(a).

Thereafter, the etching masks 207a and 207b of corrosion resistant metal films are removed to complete the formation of the crystal oscillator piece, as shown in FIG. 1(e). The overall shape of the thus formed crystal oscillator piece is the same as that shown in FIG. 9(a). In FIG. 1(e), the directions of the crystal axes (+X, Y', +Z) of the crystal wafer are shown, but it should be noted that the directions of the crystal axes are the same throughout FIGS. 1(a) to 1(e).

Figure 2:
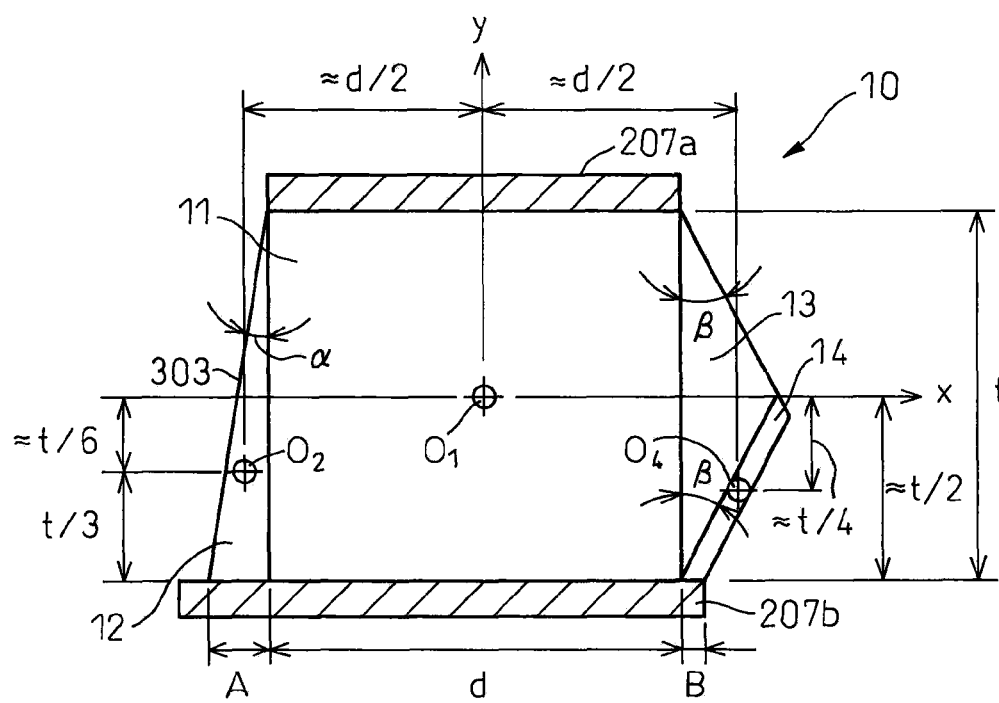
FIG. 2 is a diagram explaining the design of a vibrating tine cross section for achieving a principal axis substantially parallel to X axis.
Figure 2:
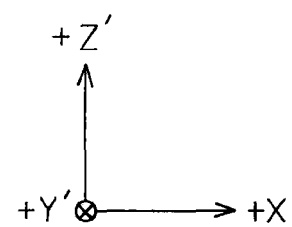

FIG. 2 is a diagram explaining the design of a vibrating tine cross section for achieving a principal axis substantially parallel to the X axis.

The directions of principal axes are determined by the cross-sectional shape of the vibrating tine. More specifically, if the product of inertia of area with respect to a rectangular coordinate system having its origin at the centroid of the vibrating tine cross section and its horizontal axis parallel to X axis is nearly zero, then the vibrating tine cross section has a principal axis substantially parallel to the X axis. In view of this, the method of designing the vibrating tine cross section that the present invention aims to achieve will be described below based on the vibrating tine cross section 10 shown in FIG. 2.

First, the vibrating tine cross section 10 is divided into a rectangular first part 11 in the center, a triangular second part 12 at the left in the diagram, a triangular third part 13 at the right in the diagram, and an approximately parallelogram-shaped fourth part 14 at the lower right of the diagram.

The left side portion of the vibrating tine cross section in the diagram is etched at an angle $\alpha$ in the etching step. Accordingly, if the lower etching mask 207b is set so as to protrude sufficiently further outward than the upper etching mask 207a, the second part 12 is formed as a residue on a first side face 303 at the left of the vibrating tine. Since the second part 12 is determined by the vertex angle $\alpha$, it can be produced to always have the same cross section, irrespective of errors in the accuracy of the alignment apparatus.

The right side portion of the vibrating tine cross section in the diagram is etched at an angle $\beta$ in the etching step. As a result, a residue (third part 13+fourth part 14) is formed on a second side face at the right of the vibrating tine. Since the positional relationship between the upper etching mask 207a and the lower etching mask 207b changes due to errors in the accuracy of the alignment apparatus, it does not follow that the same residue is always formed in the right side portion of the vibrating tine cross section in the diagram.

Next, the product of inertia of area in the rectangular coordinate system whose horizontal axis is parallel to the X axis, and whose origin is at the centroid of the vibrating tine cross section 10 having the first to fourth parts 11 to 14, is obtained by calculation.

The centroid of the cross section 10 is denoted by $O_1$, the centroid of the second part 12 by $O_2$, and the centroid of the fourth part 14 by $O_4$. Further, the length of the base of the first part is denoted by d, and the height by t, while the length of the base of the second part 12 is denoted by A, and that of the fourth part 14 by B. Then, coordinate axes (horizontal axis x and vertical axis y) for calculation are defined in the rectangular coordinate system having its origin at the centroid $O_1$ and its horizontal axis parallel to the X axis, and the thus defined rectangular coordinate system will hereinafter be referred to as the designated coordinate system.

Further, as the areas of the second and fourth parts 12 and 14 are very small compared with the area of the cross section 10, the height of the centroid $O_1$ of the cross section 10, measured from the base, can be approximated as t/2, as shown in the diagram.

Since the first part 11 is vertically symmetrical about the horizontal axis x of the designated coordinate system, the product of inertia of area, $M_{11}$, of that part with respect to the designated coordinate system is zero.

On the other hand, the product of inertia of area, $M_{12}'$, with respect to a rectangular coordinate system having its origin at the centroid $O_2$ of the second part 12 and its horizontal axis parallel to the X axis is $(A^2 t^2/72)$. Approximating the horizontal distance between $O_1$ and $O_2$ as d/2 and the vertical distance as t/6, and applying the known parallel axis theorem, the product of inertia of area, $M_{12}$, of the second part 12 in the designated coordinate system is given as $(A^2 t^2/72)+(A t^2 d/24)$. As the absolute value of $(A^2 t^2/72)$ is very small compared with $(A t^2 d/24)$, $M_{12}$ can be approximated as $A t^2 d/24$.

Since the third part 13 is vertically symmetrical about the horizontal axis x of the designated coordinate system, the product of inertia of area, $M_{13}$, of that part with respect to the designated coordinate system is zero.

On the other hand, the product of inertia of area, $M_{14}$ with respect to a rectangular coordinate system having its origin at the centroid $O_4$ of the fourth part 14 and its horizontal axis parallel to the X axis is $(Bt^3 \tan \beta/96)$. Approximating the horizontal distance between $O_1$ and $O_4$ as d/2 and the vertical distance as t/4, and applying the known parallel axis theorem, the product of inertia of area, $M_{14}$, of the fourth part 14 in the designated coordinate system is given as $(Bt^3 \tan \beta/96) - (Bt^2 d/16)$. As the absolute value of $(Bt^3 \tan \beta/96)$ is very small compared with $(Bt^2 d/16)$, $M_{14}$ can be approximated as $-Bt^2 d/16$.

The product of inertia of area, $M_{10}$, of the entire cross section 10 with respect to the designated coordinate system is $M_{11}+M_{12}+M_{13}+M_{14}$, and hence $M_{10}=(A t^2 d/24)-(Bt^2 d/16)$. That is, when the values of A and B are selected such that $(A t^2 d/24)=(Bt^2 d/16)$, the product of inertia of area, $M_{10}$, of the cross section 10 becomes nearly zero, achieving an ideal crystal oscillator piece whose principal axis in the vibrating tine cross section is substantially parallel to the X axis.

As described earlier, when the relationship between A and B is obtained from the above condition, $B=(16/24)\times A$, and thus B can be approximated as 0.7A. That is, when B is set equal to 0.7A, the product of inertia of area, $M_{10}$, of the cross section 10 becomes zero, achieving an ideal crystal oscillator piece whose principal axis in the vibrating tine cross section is substantially parallel to the X axis.

By setting the lower etching mask 207b so as to protrude sufficiently further outward than the upper etching mask 207a, as earlier described, the second part can be produced to always have the base length $A=t \times \tan \alpha$, irrespective of errors in the accuracy of the alignment apparatus.

On the other hand, due to errors in the accuracy of the alignment apparatus, it is not possible to place the upper and lower etching masks 207a and 207b so that they are always displaced relative to each other by B.

However, by designing the cross section so that the upper and lower etching masks 207a and 207b are displaced relative to each other by B, the vibrating tine can be produced within the accuracy error range of the alignment apparatus centered about B. That is, it is possible to prevent residues from being formed on the right and left sides of the vibrating tine in a manner unrelated to each other and prevent the principal axis of the vibrating tine cross section from becoming significantly displaced from the direction substantially parallel to the X axis by being affected by alignment errors at the first and second side faces as in the prior art.

As described in detail above, in the present invention, the cross section is designed so that the amount of displacement between the upper and lower etching masks 207a and 207b in the left side of the diagram becomes sufficiently larger than A (that is, equal to or larger than the sum of A and the accuracy error of the alignment apparatus), and so that the amount of displacement between the upper and lower etching masks 207a and 207b in the right side of the diagram becomes equal to B. That is, in the present invention, the upper and lower photomasks 202 and 204 are aligned in FIG. 1(b) by considering the above points. With this design, it is possible to significantly increase the reproducibility of the ideal crystal oscillator piece whose principal axis in the vibrating tine cross section is substantially parallel to the X axis.

Furthermore, since B can be approximated as 0.7A=0.7×tan α, the value of B also can be handled as a function of the vertex angle α.

Figure 3:
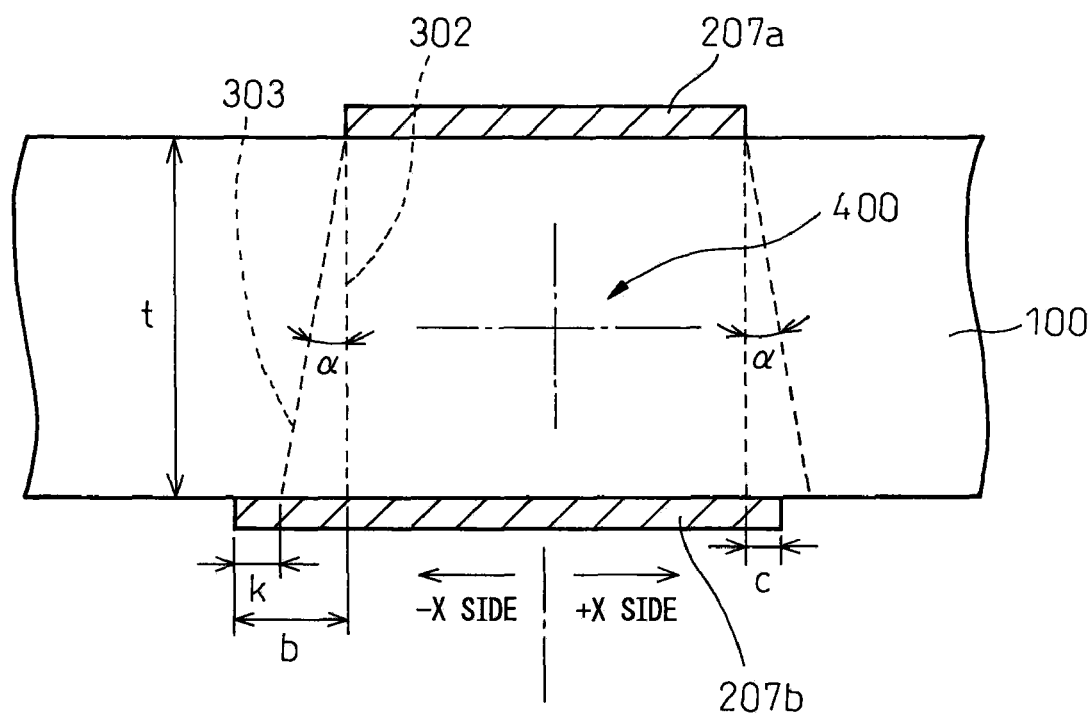
FIG. 3 is a diagram showing the sizes of etching masks used in the manufacturing process of the crystal oscillator piece.
Figure 3:
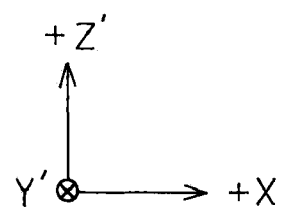

FIG. 3 is an enlarged view showing a portion of the crystal wafer 100 after the photoresist films 201a and 201b are removed.

The vibrating tine pattern on the lower photomask 204 is set wider than the vibrating tine pattern on the upper photomask 202. Accordingly, as shown in FIG. 3, the lower etching mask 207b is formed wider than the upper etching mask 207a, so that the etching mask 207b has a first protruding portion b at the first side face at the −X end of the crystal axis 400 and a second protruding portion c at the second side face at the +X end.

As shown in FIG. 3, let α denote the angle that a straight line 302 passing at the −X end of the upper etching mask 207a and extending parallel to the Z' axis makes with a face 303 along which the crystal wafer 100 is etched, and t denote the thickness of the crystal wafer. Then, as earlier described, the value of the first protruding portion b is set equal to or larger than the sum of A and the accuracy error of the alignment apparatus, i.e., b is set larger than t×tan α+p. More specifically, b>t×tan α+p. On the other hand, the value of the second protruding portion c is set equal to B. Since B can be approximated as 0.7A, it follows that 0<c<A or 0<c<t×tan α.

In the present embodiment, the first protruding portion b is set equal to t×tan α+k, where k is the amount of mask offset of the lower etching mask 207b at the first side face. Since the angle α is about 1°, the amount of mask offset, k, is chosen to be 2 μm, and thus the value of the first protruding portion b [μm]=t [μm]×0.017+2 μm. Letting ±p denote the accuracy of the double-side aligner used, the amount of mask offset, k, is set larger than p, i.e., k>p; then, even if a positional displacement occurs between the upper and lower etching masks 207a and 207b, the first side face is unaffected by the positional displacement and, when etched from the upper surface, a single sloping face is formed on the first side face, thus always forming a residue in a predetermined shape on the first side face.

The value of the second protruding portion c is set equal to 0.7A=0.7×t×tan α. Since the angle α is about 1°, c=t×0.012.

Figure 4:
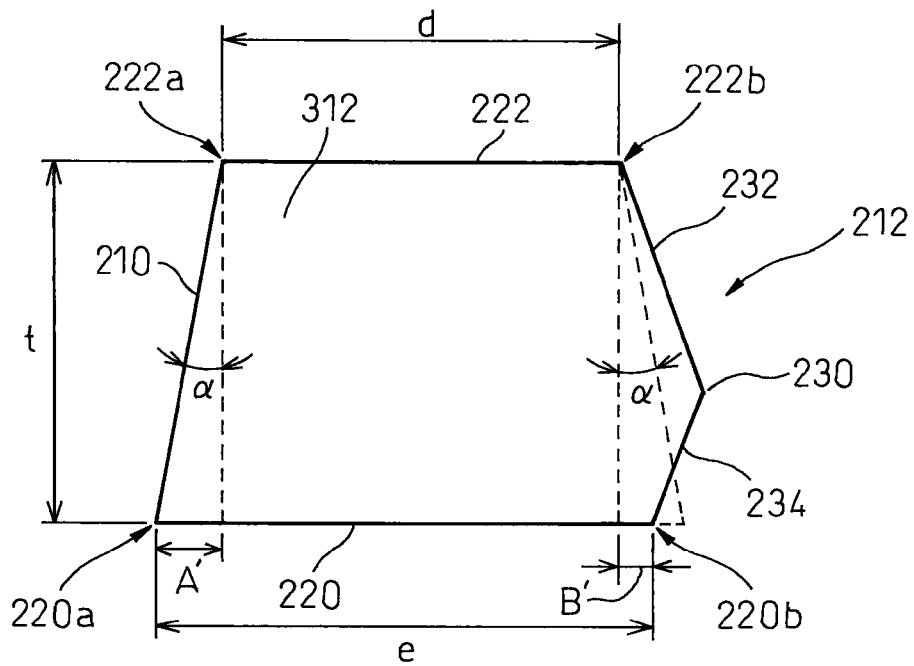
FIG. 4 is a diagram showing the cross-sectional shape of a vibrating tine of the crystal oscillator piece according to the present invention.
Figure 4:
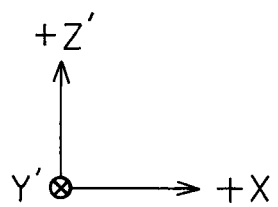

FIG. 4 is a diagram showing the cross-sectional shape of the vibrating tine of the crystal oscillator piece.

As shown in FIG. 4, the vibrating tine 313 of the crystal oscillator piece manufactured by the manufacturing method of the present invention has an upper surface 222 and lower surface 220 having different widths, a first side face 210 formed from a single sloping face, and a second side face 212 having a convex shape and formed from two sloping faces 232, 234 and a ridge 230 formed by the two sloping faces. The width d of the upper surface 222 is set smaller than the width e of the lower surface 220. Here, let A' denote the difference between an edge 222a of the upper surface 222 at the first side face 210 and an edge 220a of the lower surface 220 at the first side face 210 as measured in the width direction, B' denote the difference between an edge 222b of the upper surface 222 at the second side face 212 and an edge 220b of the lower surface 220 at the second side face 212 as measured in the width direction, a denote the etching angle at the first side face 210, and t denote the thickness of the crystal wafer.

Then, A' in the vibrating tine 313 of the actually manufactured crystal oscillator piece has substantially the same value as the design value A (see FIG. 2), as previously described with reference to FIG. 2. Further, B' in the vibrating tine 313 of the actually manufactured crystal oscillator piece varies within the range defined by the accuracy of the double-side aligner, i.e., ±p, with respect to the design value B (see FIG. 2). The vibrating tine 313 of the actually manufactured crystal oscillator piece should at least satisfy the relations A'≈t×tan α and B'<A', as previously described.

Figure 13A:
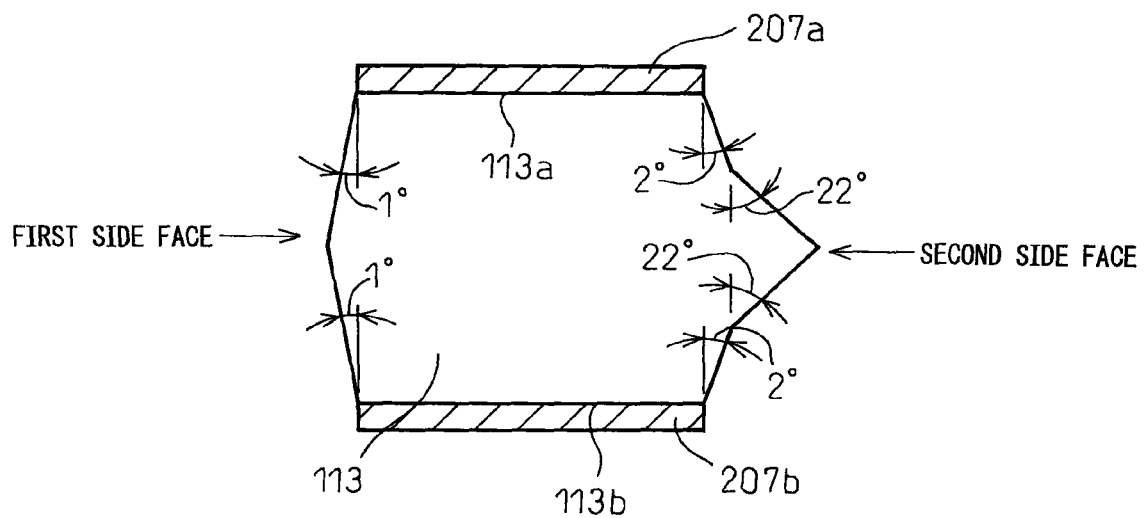
FIG. 13(a) is a cross-sectional view showing one example of crystal etching residue formation.
Figure 13B:
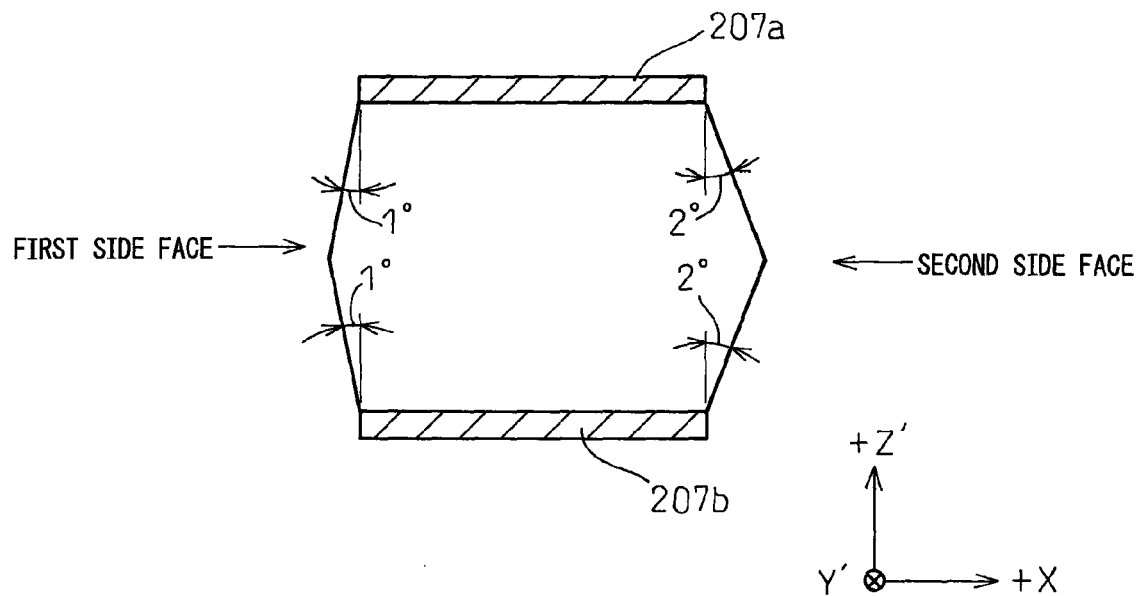
FIG. 13(b) is a cross-sectional view showing another example of crystal etching residue formation.
Figure 14A:
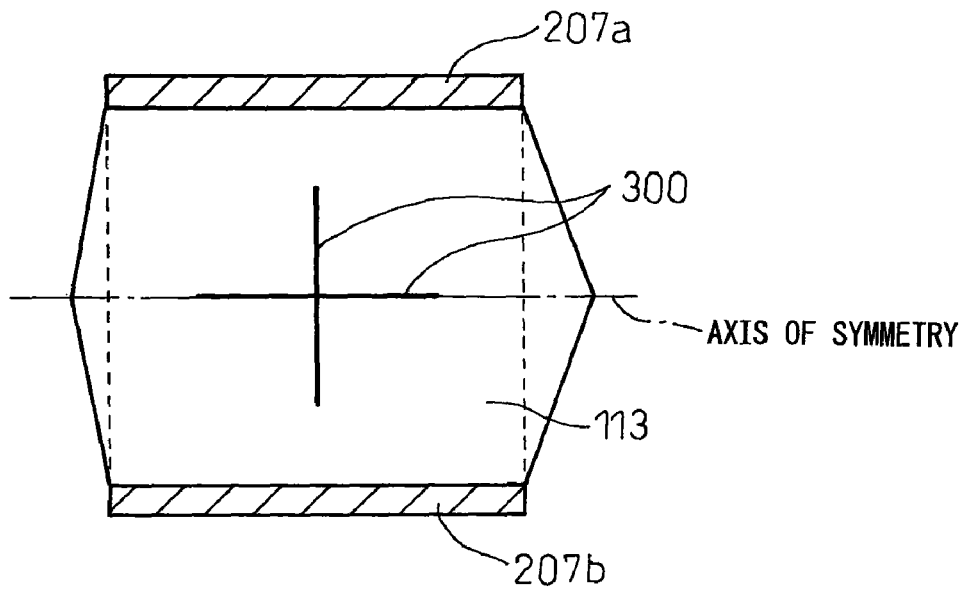
FIG. 14(a) is a cross-sectional view showing one example when there is no etching mask displacement.
Figure 14B:
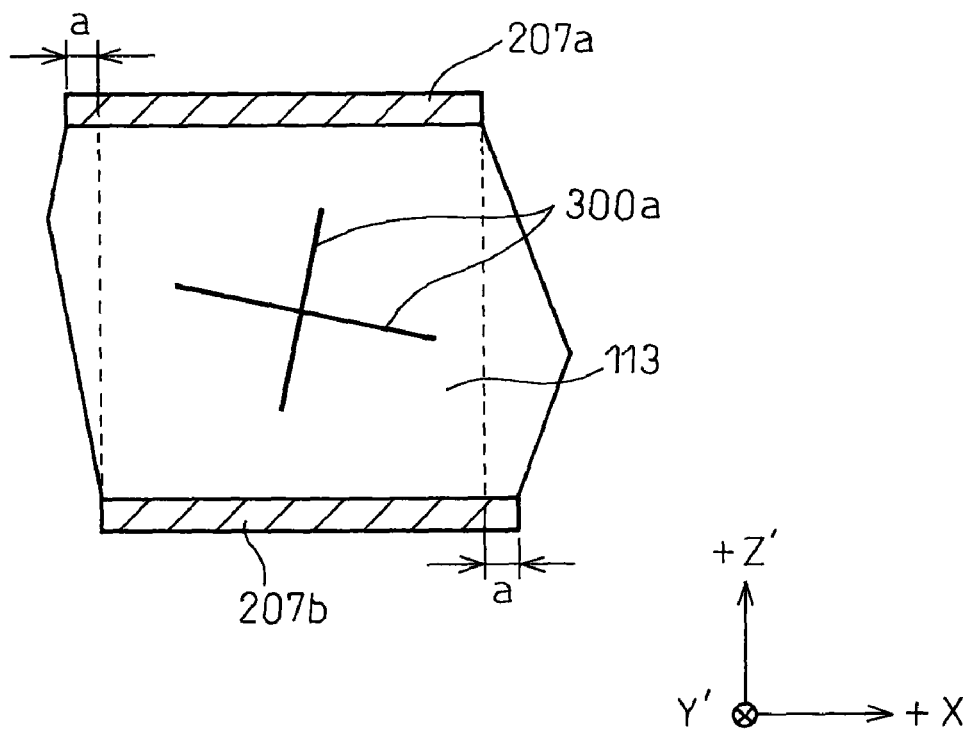
FIG. 14(b) is a cross-sectional view showing another example when an etching mask displacement occurs.
Figure 15A:
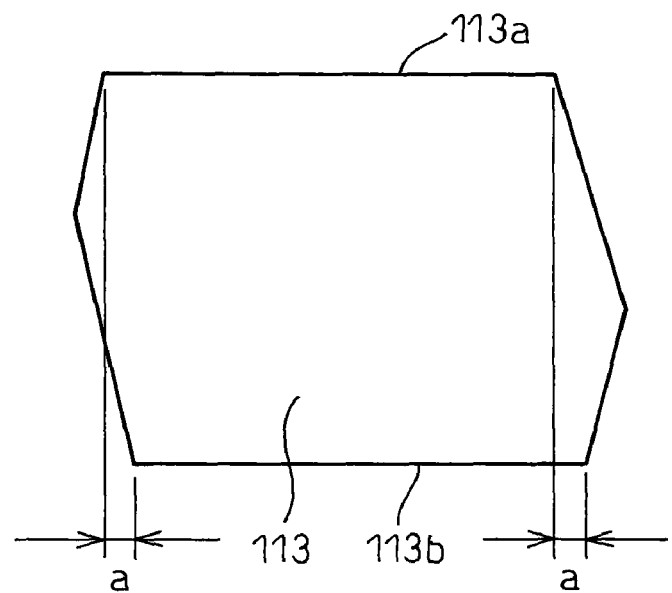
FIG. 15(a) is a diagram showing a positional displacement between the upper and lower surfaces in the cross section of the vibrating tine.
Figure 15B:
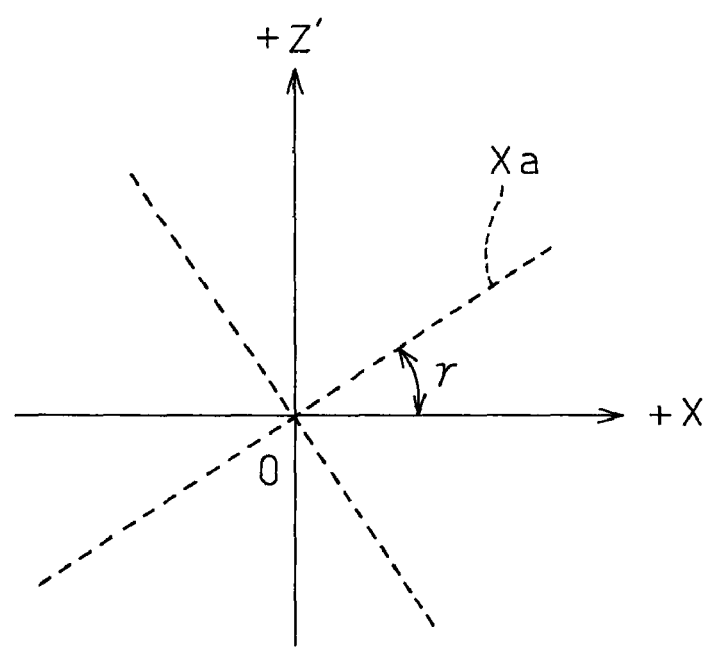
FIG. 15(b) is a diagram showing the angle of displacement of a principal axis in the cross section of the vibrating tine of FIG. 15(a).
Figure 16:
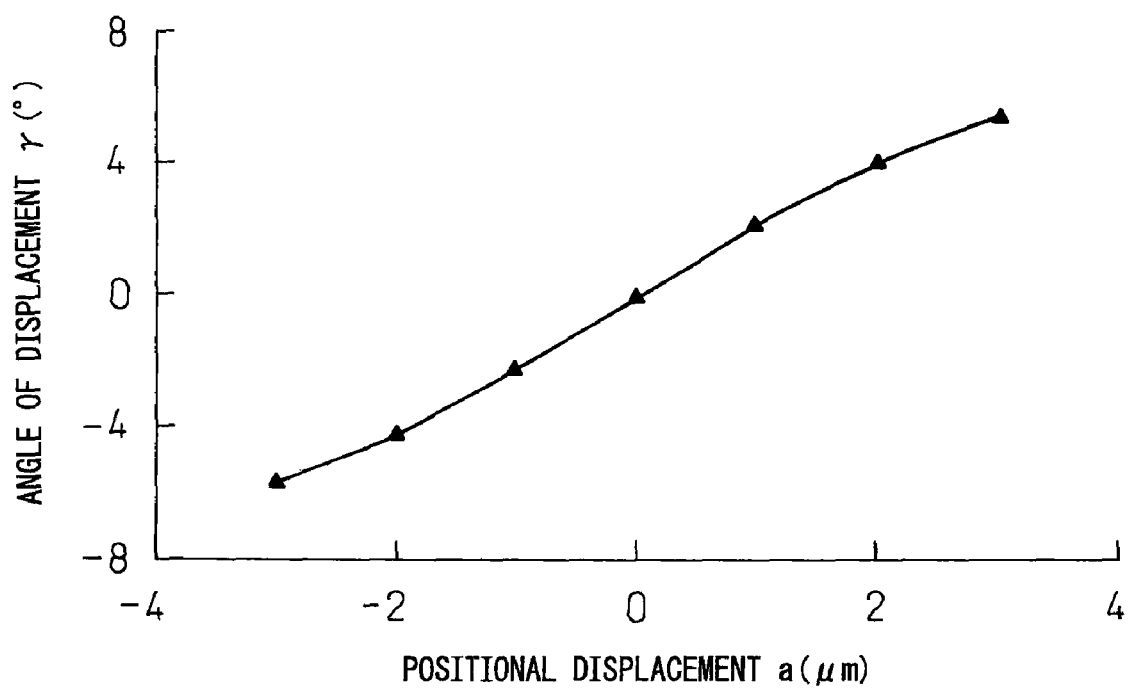
FIG. 16 is a diagram showing the relationship between the angle of displacement of the principal axis and the positional displacement occurring between upper and lower etching masks during the manufacturing process of the crystal oscillator piece.

Further, in the case of short-time etching, where the residue is formed on the second side face at angles of 22° and 2° relative to the Z' axis (as shown in FIG. 13(a)), as well as in the case of long-time etching, where the residue is formed only at 2° (as shown in FIG. 13(b)), the effect of the present invention can be achieved provided that the first side face is formed from a single sloping face.

Figure 5:
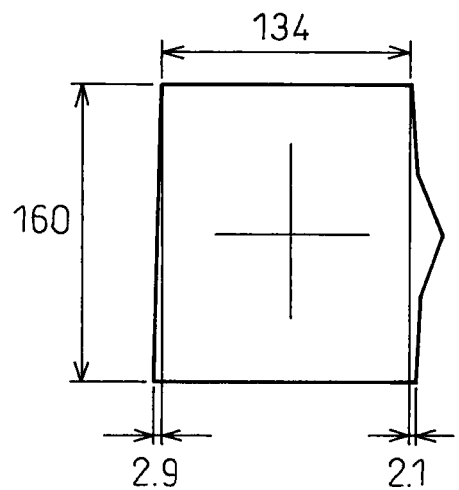
FIG. 5 is a diagram created by tracing the cross-sectional shape of the vibrating tine of the crystal oscillator piece actually manufactured by the manufacturing method of the present invention.

FIG. 5 is a diagram of the tracing of the cross-sectional shape of the vibrating tine 313 of the crystal oscillator piece actually manufactured by the manufacturing method of the present invention.

In the example of FIG. 5, the following values were used: d=134 μm, t=160 μm, the angle α=1°, A'=2.9 μm, and B'=2.1 μm. Further, the displacement of the principal axis of the crystal oscillator piece shown in FIG. 5 was −0.07°, and the relative value of the leakage output was 0.09.

Since t×tan α=2.72, it is believed that the cross-sectional shape satisfies the relations A'≈t×tan α and B'<A'.

Figure 6:
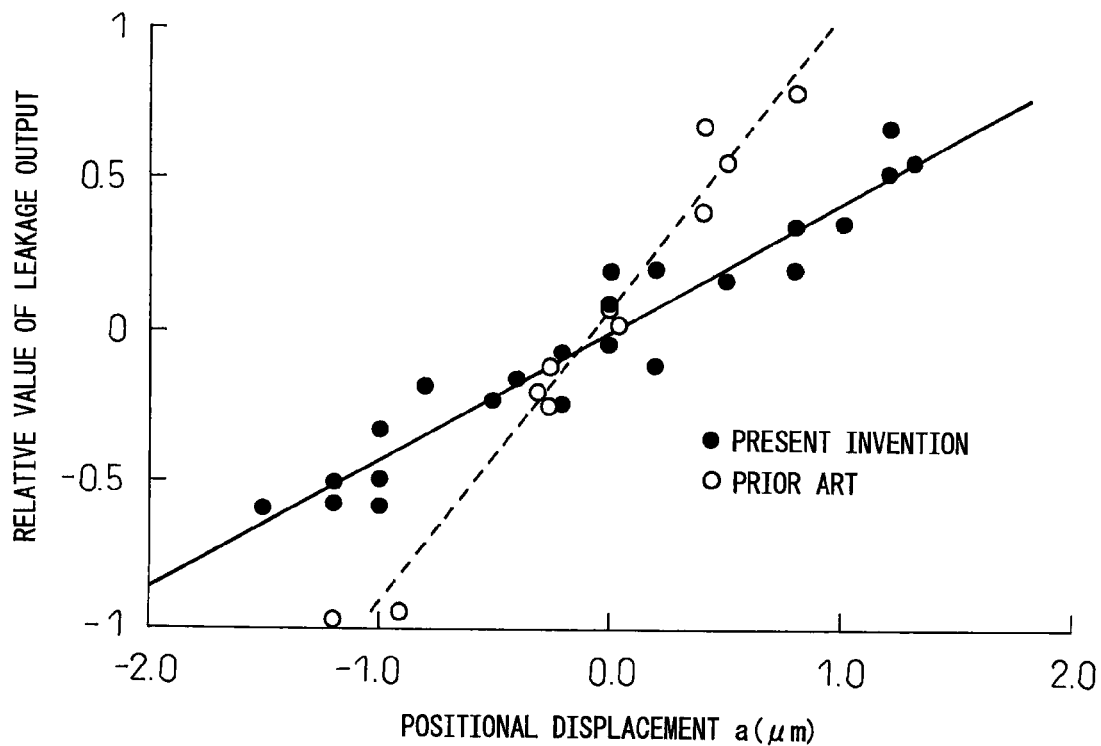
FIG. 6 is a diagram showing the relationship between the relative value of leakage output of the crystal oscillator piece and the positional displacement between the etching masks.

FIG. 6 is a diagram showing the relationship between the leakage vibration of the crystal oscillator piece and the positional displacement, a, between the upper and lower etching masks relative to the set value.

The data in FIG. 6 shows the results obtained by actually measuring the leakage output resulting from the leakage vibration associated with the positional displacement, a. The abscissa represents the amount of positional displacement (μm) between the upper and lower etching masks relative to the set value. Each unfilled circle indicates the relative value of the leakage output of the crystal oscillator piece manufactured by the prior art method, and each filled circle indicates the relative value of the leakage output of the crystal oscillator piece manufactured by the manufacturing method shown in FIG. 1. As can be seen from FIG. 6, the leakage output resulting from the leakage vibration of the crystal oscillator piece of the present embodiment is reduced to about one half compared with the prior art.

As described above, in the crystal oscillator piece of the present embodiment, since the first side face is formed from a single sloping face, the difference A' between the upper and lower surfaces as measured in the width direction is always the same provided that the wafer thickness t is held constant. On the other hand, the difference B' between the upper and lower surfaces at the second side face is adjusted so that one of the principal axes of the vibrating tine cross section is oriented substantially parallel to the X axis. As a result, the direction in which the bending force is applied due to the piezoelectric effect coincides with the direction of the principal axis of the cross section, so that the driving vibration does not occur obliquely to the principal plane of the oscillator but occurs in parallel to it, and hence no leakage vibration in the Z' axis direction. In the prior art method, both A' and B' are affected by manufacturing variations, but in the present invention, only B' is affected by manufacturing variations, and thus the leakage vibration associated with the upper/lower positional displacement can be reduced to about one half.

Figure 7:
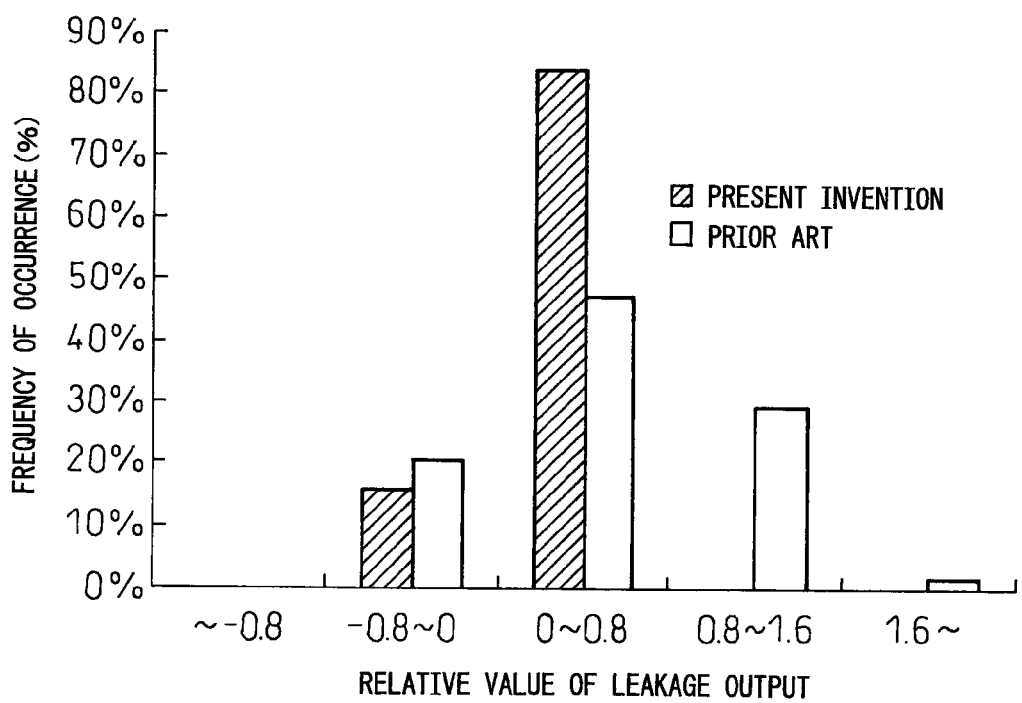
FIG. 7 is a diagram showing the relationship between the relative value of leakage output of the crystal oscillator piece and its frequency of occurrence.
Figure 8:
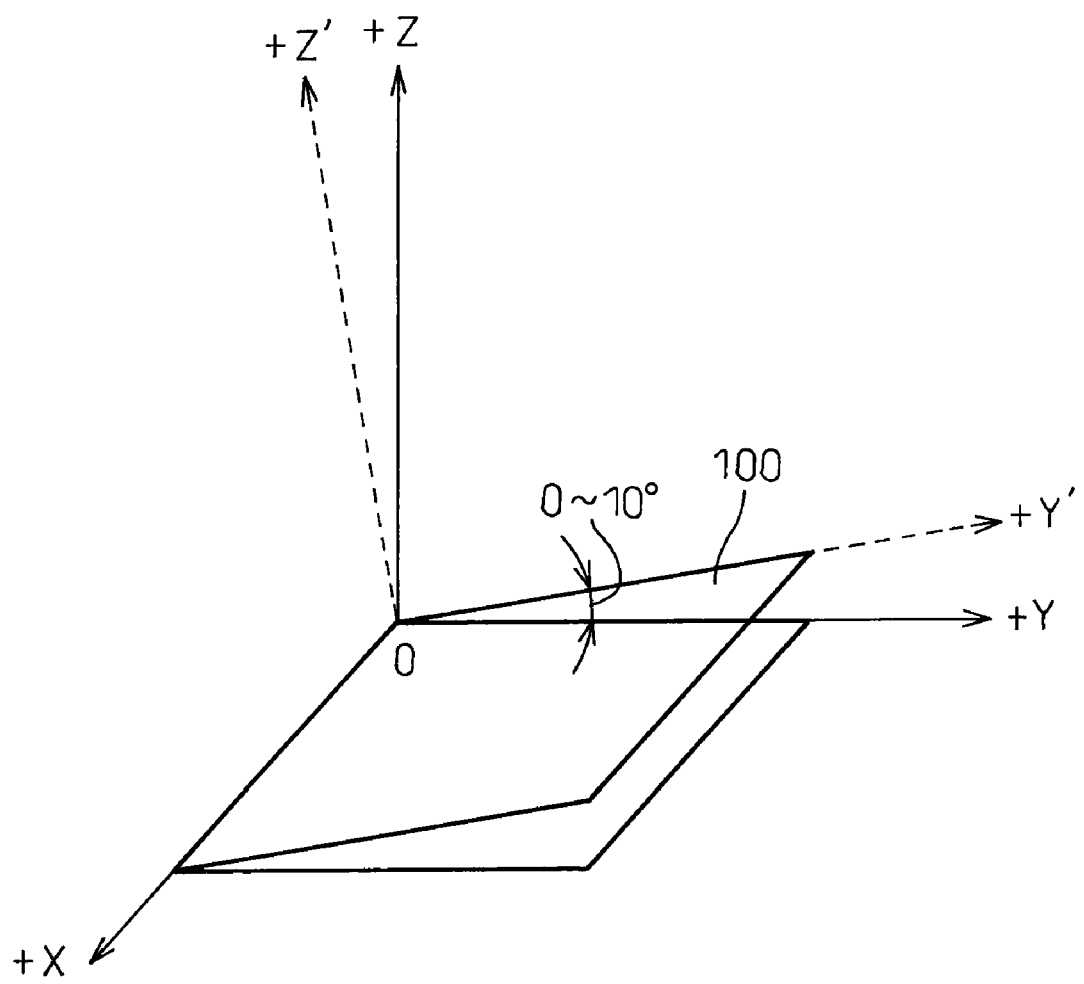
FIG. 8 is a diagram showing a crystal wafer.

FIG. 7 is a diagram showing the relationship between the relative value of the leakage output of the crystal oscillator piece and its frequency of occurrence.

Data was taken by actually measuring the relative value of the leakage output on the crystal oscillator piece (44 examples) manufactured by the prior art method and the crystal oscillator piece (32 examples) manufactured by the manufacturing method shown in FIG. 1, and FIG. 7 shows the results representing the frequency of occurrence (%) of the relative value of the leakage output falling within a prescribed range.

The method of measuring the relative value of the leakage output will be described by taking as an example a gyro that uses a two-tines tuning fork crystal oscillator.

First, one tine is set as a driving tine which is provided with a specific electrode for causing the tine to produce driving vibration in the X axis direction, and the other tine is set as a detection tine which is provided with a specific electrode for detecting vibration in the Z' axis direction.

Next, the driving tine is set into self oscillation by satisfying its oscillating conditions. The oscillator operates in an in-plane flexural mode in which when the driving tine moves in the X axis direction, the detection tine moves in the −X axis direction in such a manner as to balance the amount of motion.

Since the detection tine is provided with the detection electrode for detecting vibration in the Z' axis direction, the detection signal can be measured by amplifying the signal from the electrode. Then, when the driving tine is set into self oscillation and when angular velocity about the Y' axis is not applied so that Coriolis forces do not act, the vibration component detected occurring in the Z' axis direction is the leakage vibration, and the leakage output can be measured by amplifying the signal from the detection electrode that detected the leakage vibration.

As can be seen from FIG. 7, the frequency of occurrence of the relative value of the leakage output falling within a low value region is higher for the crystal oscillator piece manufactured by the manufacturing method shown in FIG. 1. In other words, the crystal oscillator piece having a principal axis parallel to the X axis can be produced with a higher frequency of occurrence by the manufacturing method shown in FIG. 1.

The prior art manufacturing method has had the problem that, due to the limited accuracy of the double-side alignment apparatus for placing the photomasks, if a positional displacement occurs between the etching masks, both the first and second side faces of the crystal oscillator piece are affected and, as a result, the relative value of the leakage output of the crystal oscillator piece increases. By contrast, in the present invention, the first protruding portion b is set to have a sufficient length so that, even when a positional displacement occurs between the etching masks, the first side face can always be formed in the predetermined shape. That is, the residue is always formed in the predetermined shape on the first side face.

Next, in the present invention, the second protruding portion c is set so that the second side face well balanced with the first side face is formed when no positional displacement occurs between the etching masks. In other words, when there is no positional displacement between the etching masks, the residue perfectly balanced with the residue on the first side face are formed on the second side face.

By setting the design target value so that the second side face well balanced with the first side face is formed when no positional displacement occurs between the etching masks, it is possible to hold the relative value of the leakage output to a minimum even when a small amount of positional displacement occurs between the etching masks during the actual manufacturing process.

That is, when a positional displacement occurs between the etching masks, the actual value of B' changes, and the residue on the second side face deviates from the optimum value. However, since the residue on the first side face is always formed in the predetermined shape, the influence is limited to the residue formed on the second side face, and thus it becomes possible to reduce the relative value of the leakage output compared with the prior art. Furthermore, the deviation of the residue formed on the second side face is very small, because it only varies within the accuracy range of the double-side alignment apparatus (±p) centered about the optimum point (ideal value B). Accordingly, in the manufacturing method of the present invention, based on the earlier described two design points of the invention, it becomes possible to drastically improve the manufacturing efficiency of the crystal oscillator piece conforming to standard and capable of reducing the relative value of the leakage output.

When the crystal oscillator piece of the present invention is used for a vibratory gyro, the S/N ratio of the vibratory gyro can be improved, and stable temperature characteristics can be achieved.

In the above description, the etching angle $\alpha$ at the first side face has been described as being about 1°, but since the etching angle $\alpha$ varies depending on such conditions as the cut angle of the crystal wafer and the etching conditions, it is preferable to determine the value of A and the amount of first protrusion b to match these conditions.

The value of the amount of second protrusion c becomes somewhat different when various basic conditions, for example, wafer cut angle, etching solution composition, temperature, etc., are changed. This is because the value of $\alpha$ and the value of $\beta$ change, resulting in a situation where B may not be properly approximated as 0.7A. As previously described, the amount of second protrusion c has been approximated as $0.7 \times t \times \tan \alpha$, but in the practical application range of the Z-cut crystal oscillator piece described in the embodiment, when variations in the value of $\alpha$ and the value of $\beta$ are considered, the amount of second protrusion c falls within the range defined by $$0.65 \times t \times \tan \alpha < c < 0.75 \times t \times \tan \alpha$$

To verify whether the approximated value for the amount of second protrusion c is proper or not, the relationship between the relative value of the leakage output and its frequency of occurrence, such as shown in FIG. 7, is obtained, to check whether the peak frequency of occurrence appears near the point where the relative value of the leakage output is zero. If the peak frequency of occurrence is displaced from that point, the value c is varied within the above range, to search for the proper value for the amount of second protrusion c. However, if the various conditions have been substantially changed, the proper value for the amount of second protrusion c changes beyond the above range. In that case also, the proper value for the amount of second protrusion c should be obtained using the above-described technique. Further, when the basic conditions are changed, the value c changes somewhat, but manufacturing variations in the basic conditions are not large enough to cause the value c to change, and the amount of second protrusion c always remains constant.

The present embodiment has been described by dealing with an example in which the first etching mask is placed on the upper surface (+Z direction of the crystal axis) of the crystal and the second etching mask on the lower surface (−Z direction of the crystal axis), but it should be noted that the effect of the present invention can be achieved even if the second etching mask is placed on the upper surface and the first etching mask on the lower surface.

While the embodiment has been described above by taking the two-tined tuning fork crystal oscillator piece as an example, the present invention is not limited to the above embodiment but can be applied to other types of crystal oscillator piece than the two-tine type, for example, to a crystal oscillator piece of a single-tine type, three-tine type, four-tine type, or five-tine type.

What is claimed is:

1. A method for manufacturing a crystal oscillator piece containing a vibrating tine having a first side face and a second side face, comprising the steps of:

forming a first etching mask on an upper surface of a crystal wafer and a second etching mask on a lower surface of said crystal wafer; and forming said vibrating tine by immersing said crystal wafer in an etching solution thereby dissolving crystal portions not covered with said first and second etching masks, wherein said second etching mask is designed to have a first protruding portion protruding from a position corresponding to a first edge of said first etching mask, said first protruding portion being chosen to have such a length that a first residue is formed in a predetermined shape on said first side face, irrespective of a positional displacement between said first and second etching masks, and said first and second etching masks are designed so that a second residue formed on said second side face is adjusted so as to ensure that one of two principal axes passing through a centroid and dynamically perpendicular to each other in a cross section taken perpendicularly to a longitudinal direction of said vibrating tine is oriented substantially parallel to said upper or lower surface of said crystal wafer.

2. The method for manufacturing the crystal oscillator piece according to claim 1, wherein said first etching mask is formed with a width smaller than the width of said second etching mask, and said first etching mask and said second etching mask are formed on the respective surfaces of said crystal wafer in such a manner that a difference, b, between the first edge of said first etching mask and the corresponding first edge of said second etching mask, as measured at said first side face, satisfies the relation $$b > t \times \tan \alpha$$

where t represents the thickness of said crystal wafer and $\alpha$ an etching angle at said first side face.

3. The method for manufacturing the crystal oscillator piece according to claim 2, wherein said first etching mask and said second etching mask are formed on the respective surfaces of said crystal wafer in such a manner that the difference, b, between the first edge of said first etching mask and the corresponding first edge of said second etching mask satisfies the relations $$b = t \times \tan \alpha + k$$

$$k > p$$

where p represents the accuracy of alignment between said first etching mask and said second etching mask.

4. The method for manufacturing the crystal oscillator piece according to claim 1, wherein said first etching mask is formed with a width smaller than the width of said second etching mask, and said first etching mask and said second etching mask are formed on the respective surfaces of said crystal wafer in such a manner that a difference, c, between the second edge of said first etching mask and the corresponding second edge of said second etching mask, as measured at said second side face, satisfies the relation $$c < t \times \tan \alpha$$

where t represents the thickness of said crystal wafer and $\alpha$ the etching angle at said first side face.

5. The method for manufacturing the crystal oscillator piece according to claim 4, wherein said first etching mask is formed with a width smaller than the width of said second etching mask, and said first etching mask and said second etching mask are formed on the respective surfaces of said crystal wafer in such a manner that the difference, c, between the second edge of said first etching mask and the corresponding second edge of said second etching mask, as measured at said second side face, satisfies the relation $$c = 0.7 \times t \times \tan \alpha$$

where t represents the thickness of said crystal wafer and $\alpha$ the etching angle at said second side face.

* * * * *